United States Patent
Eilert et al.

(10) Patent No.: US 11,636,893 B2
(45) Date of Patent: Apr. 25, 2023

(54) MEMORY DEVICE WITH MULTIPLE ROW BUFFERS

(71) Applicant: Micron Technology, Inc., Boise, ID (US)

(72) Inventors: Sean S. Eilert, Penryn, CA (US); Ameen D. Akel, Rancho Cordova, CA (US); Shivam Swami, Folsom, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/073,621

(22) Filed: Oct. 19, 2020

(65) Prior Publication Data

US 2022/0122650 A1 Apr. 21, 2022

(51) Int. Cl.
*G11C 11/40* (2006.01)
*G11C 11/4093* (2006.01)
*G11C 11/406* (2006.01)
*G11C 11/4091* (2006.01)
*G11C 11/408* (2006.01)

(52) U.S. Cl.
CPC ...... *G11C 11/4093* (2013.01); *G11C 11/4082* (2013.01); *G11C 11/4091* (2013.01); *G11C 11/40603* (2013.01)

(58) Field of Classification Search
CPC .......... G11C 11/4063; G11C 11/40603; G11C 11/4082; G11C 11/4091
See application file for complete search history.

(56) References Cited

U.S. PATENT DOCUMENTS

| 2003/0135693 | A1 | 7/2003 | David | |
|---|---|---|---|---|
| 2013/0290607 | A1* | 10/2013 | Chang | G06F 9/3842 711/144 |
| 2013/0336079 | A1* | 12/2013 | Kim | G11C 11/402 365/222 |
| 2014/0208156 | A1* | 7/2014 | Muralimanohar | G11C 8/12 714/6.24 |
| 2015/0332743 | A1* | 11/2015 | Kim | G11C 16/10 711/105 |
| 2016/0034406 | A1* | 2/2016 | Hansson | G06F 13/1663 711/151 |
| 2016/0314042 | A1* | 10/2016 | Plants | G06F 3/0688 |
| 2018/0301188 | A1* | 10/2018 | Choi | G11C 13/0069 |
| 2018/0314635 | A1 | 11/2018 | Alam | |

(Continued)

OTHER PUBLICATIONS

Jacob, Bruce, "DRAM Systems Research", 5 pages, [retrieved from Internet: Aug. 2, 2021].

(Continued)

*Primary Examiner* — Han Yang
(74) *Attorney, Agent, or Firm* — Lowenstein Sandler LLP

(57) ABSTRACT

An example memory sub-system includes: a plurality bank groups, wherein each bank group comprises a plurality of memory banks; a plurality of row buffers, wherein two or more row buffers of the plurality of row buffers are associated with each bank group; and a processing logic communicatively coupled to the plurality of bank groups and the plurality of row buffers, the processing logic to perform operations comprising: receiving, from a host, a command identifying a row buffer of the plurality of row buffers; and perform an operation with respect to the identified row buffer.

20 Claims, 13 Drawing Sheets

(56) References Cited

U.S. PATENT DOCUMENTS

2019/0317895 A1* 10/2019 Jung .................... G11C 11/005
2019/0377634 A1* 12/2019 Jung .................... G11C 29/52

OTHER PUBLICATIONS

"DDR4 SDRAM—Understanding the Basics", https://www.systemverilog.io/ddr4-basics, 15 pages, [retrieved from Internet: Aug. 2, 2021].
U.S. Appl. No. 17/100,453, filed Nov. 20, 2020.
USPTO, Office Action for U.S. Appl. No. 17/100,453, dated Sep. 27, 2022.

* cited by examiner

MEMORY DEVICE WITH MULTIPLE ROW BUFFERS

TECHNICAL FIELD

Embodiments of the present disclosure are generally related to memory systems, and more specifically, are related to implementing dynamic random access memory (DRAM) devices with multiple row buffers per bank or a group of collocated banks.

BACKGROUND

A DRAM device includes multiple memory banks grouped in bank groups, e.g., sixteen memory banks grouped into four bank groups. Each memory bank is a memory array that includes a plurality of memory cells, such that each memory cell is capable of storing, depending on the memory cell type, one or more bits of information.

BRIEF DESCRIPTION OF THE DRAWINGS

The present disclosure will be understood more fully from the detailed description given below and from the accompanying drawings of some embodiments of the present disclosure.

DETAILED DESCRIPTION

Figure 1:
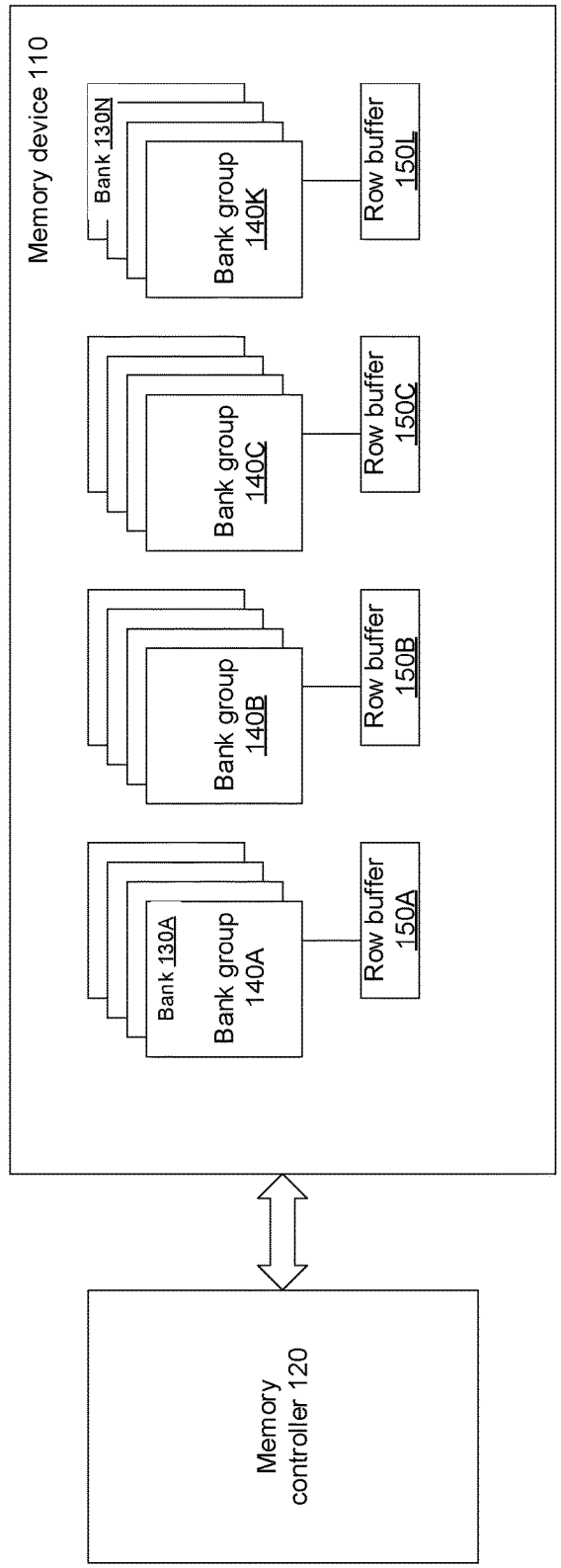
FIG. 1 schematically illustrates a high-level component diagram of an example memory sub-system implemented in accordance with aspects of the present disclosure.

Embodiments of the present disclosure are directed to implementing dynamic random access memory (DRAM) devices with multiple row buffers per bank or a group of banks.

A DRAM device includes multiple memory banks grouped in bank groups, e.g., sixteen memory banks grouped into four bank groups. Each memory bank is a memory array that includes a plurality of memory cells, such that each memory cell is capable of storing, depending on the memory cell type, one or more bits of information. A memory cell includes a capacitor that holds an electric charge and a transistor that acts as a switch controlling access to the capacitor. Accordingly, the memory cell may be programmed (written to) by applying a certain voltage, which results in an electric charge being held by the capacitor. The memory cells are joined by wordlines, which are conducting lines electrically connected to the control gates of the memory cells, and bitlines, which are conducting lines electrically connected to the drain electrodes of the memory cells.

A memory access operation begins with the ACT (Activate) command, which selects the memory bank and the row and copies the data from memory cells of the selected row to a row buffer for subsequent accesses. The RD (Read) command, which may be issued after the Activate command, specifies the starting column (bitline) location for the read operation and causes the data to be moved from the specified column location of the row buffer to the memory controller. The WR (Write) command, which may be issued after the Activate command, specifies the starting column (bitline) location for the write operation and causes the data supplied by the memory controller to be stored at the specified column location of the row buffer.

The selected row remains active (open) for accesses until the PRE (Precharge) command is issued to that bank, which closes the open row by moving the data from the row buffer to the memory cells of the open row. Alternatively, instead of issuing an explicit Precharge command to deactivate a certain row, the RDA (Read with Auto-Precharge) and WRA (Write with Auto-Precharge) commands may be used to automatically precharge the row once the read or write operation is complete. Once a bank has been precharged, it is in the idle state and should be activated prior to any Read or Write commands being issued to that bank.

Thus, a row buffer effectively caches the data from the selected row. However, associating a single row buffer with each bank would limit the efficiency of the caching scheme. The systems and methods of the present disclosure overcome this and other deficiencies by employing multiple row buffers per bank or a group of banks. In an illustrative example, multiple row buffers (e.g., four or eight row buffers) may be dedicated to each memory bank. In another illustrative example, multiple row buffers may be shared among several collocated banks or among all banks on the die. Therefore, advantages of the systems and methods implemented in accordance with some embodiments of the present disclosure include, but are not limited to, improving the memory access efficiency by utilizing multiple row buffers, which may be dedicated to a single bank or shared between multiple banks.

FIG. 1 schematically illustrates a high-level component diagram of an example memory sub-system implemented in accordance with aspects of the present disclosure. As shown in FIG. 1, the memory sub-system 100 includes one or more memory devices 110 coupled to the memory controller 120, which may communicate to a host computer system (not shown in FIG. 1). Memory controller 120 and/or various other functional components of the memory sub-system 100 implement processing logic for performing the memory access operations described herein below. "Coupled to" herein refers to electrical connections between components, including indirect connections via one or more intervening components and direct connections (i.e., without intervening components). The memory device (e.g., DRAM device) 110 includes multiple memory banks 130A-130N, which are grouped in bank groups 140A-140K. While FIG. 1 illustrates sixteen memory banks grouped into four bank groups, various other implementations may employ other numbers of bank groups and banks. Each memory bank 130 is a memory array that includes a plurality of memory cells, such that each memory cell is capable of storing, depending on the memory cell type, one or more bits of information.

As noted herein above, the memory device 110 may further include a set of row buffers 150A-150L, which may be utilized for storing the data retrieved from a row of a bank 130. In an illustrative example, one or more row buffers 150 may be dedicated to each memory bank 130. In another illustrative example, one or more row buffers 150 may be shared between several collocated memory banks 130 (e.g., between the banks of a single bank group 140). In another illustrative example, one or more row buffers 150 may be shared between all memory banks 130 of the memory device 110.

Various other components, such as sense amplifiers, input/output interfaces, and command interfaces are omitted from FIG. 1 for clarity and conciseness. In one embodiment, the memory device 110 may be implemented as one or more integrated circuits located on one or more dies. In another embodiment, the memory sub-system 100 may be implemented as a System-on-Chip, which, in addition to the memory device 110 and memory controller 120 of FIG. 1, may include one or more processing cores and one or more input/output (I/O) interfaces.

In some implementations, the host may be aware of the scheme associating multiple row buffers with each bank or a group of banks. Accordingly, the row buffers may be directly managed by the host specifying which row buffer should be used by supplying the row buffer identifier in Activate, Read, Write, and Precharge commands, as explained in further details herein below with references to FIGS. 2A, 3A, 4A, and 5A. Alternatively, management of the row buffers may be performed by the memory sub-system and/or individual memory devices, which would require the host to supply the row address in Activate, Read, and Write commands, as explained in further details herein below with references to FIGS. 2B, 3B, 4B, and 5B.

In some implementations, the host may be aware of the scheme associating multiple row buffers with each bank or a group of banks, but the row buffer assignment may be managed by the memory device. Accordingly, the host may issue an Activate command and receives a row buffer identifier in return. The row buffer identifier may be used in subsequent requests (e.g., Read, Write, and Precharge) commands issued by the host to the memory sub-system.

Figure 2A:
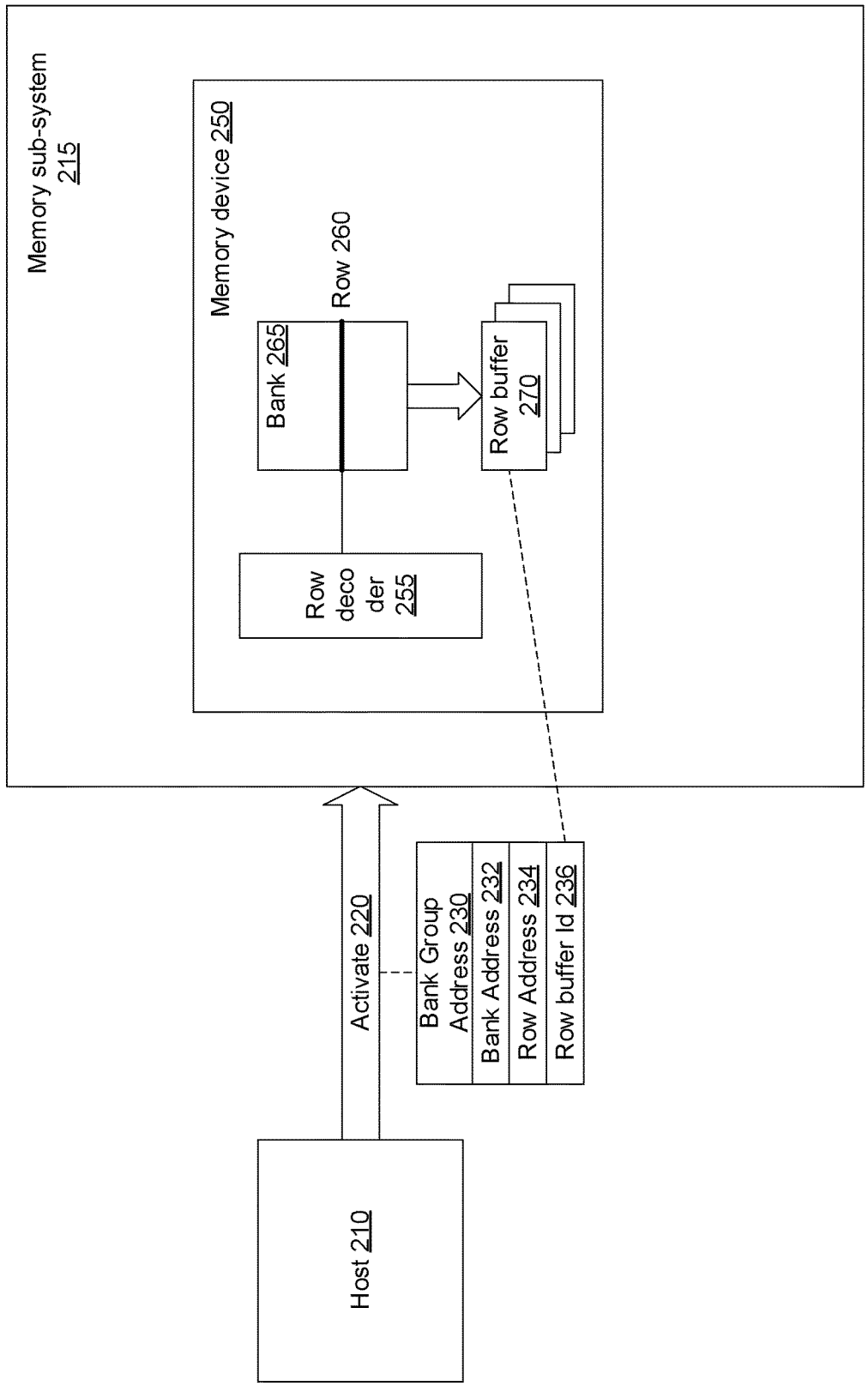
FIG. 2A schematically illustrates interactions of the host and memory sub-system executing the ACT (Activate) command in which the row buffer assignment is managed by the host.
Figure 2B:
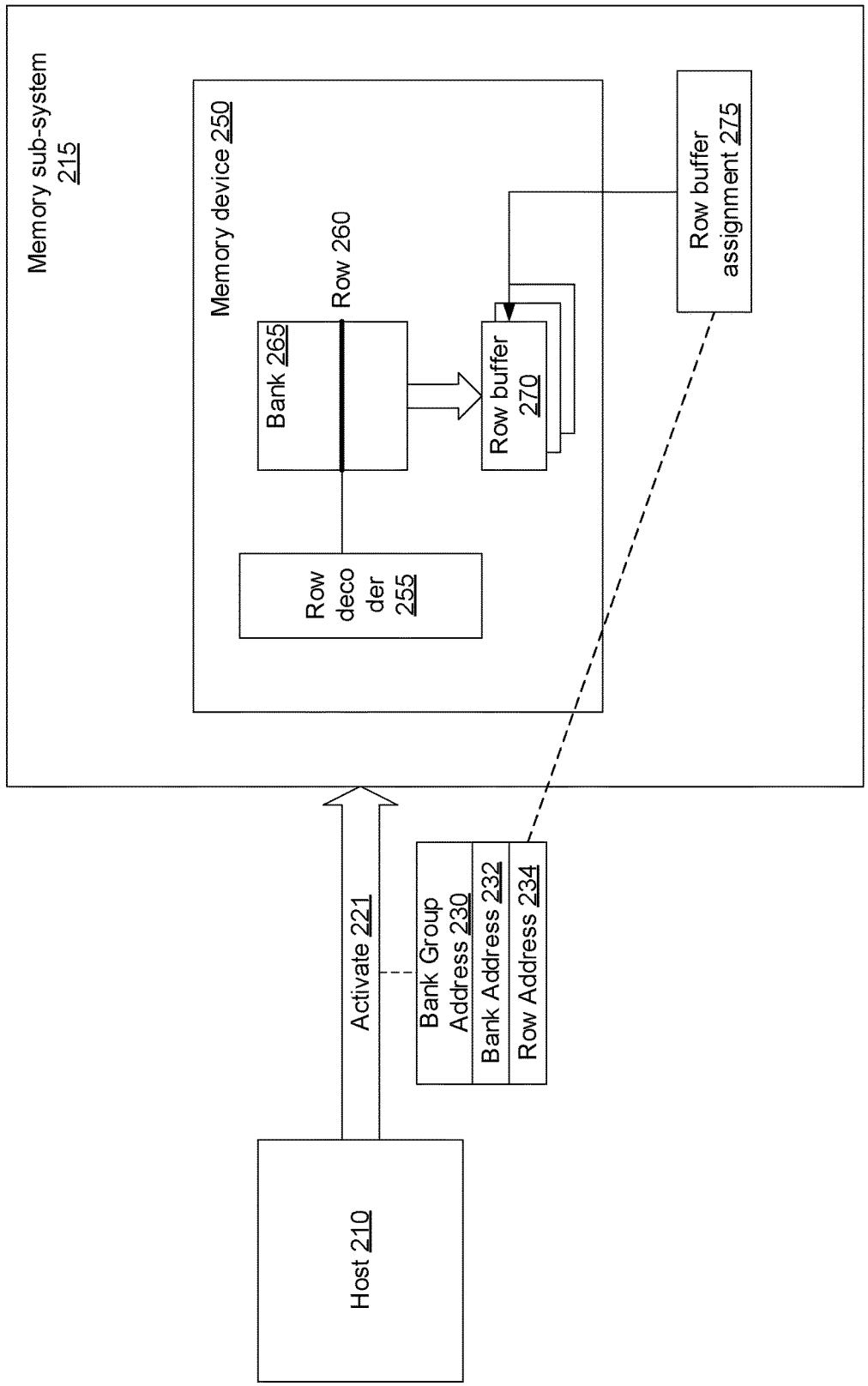
FIG. 2B schematically illustrates interactions of the host and memory sub-system executing the ACT (Activate) command in which the row buffer assignment is managed by the memory sub-system.

As noted herein above, a memory access operation begins with an ACT (Activate) command, which selects the memory bank and the row and copies the data from memory cells of the selected row to a row buffer for subsequent accesses. FIGS. 2A-2B schematically illustrates interactions of the host 210 and memory sub-system 215 executing the ACT (Activate) command.

In particular, FIG. 2A schematically illustrates interactions of the host 210 and memory sub-system 215 executing the ACT (Activate) command in which the row buffer assignment is managed by the host 210, in accordance with aspects of the present disclosure. In an illustrative example, the host 210 may initiate a memory access operation by issuing an ACT (Activate) command 220.

Since the row buffer assignment is managed by the host 210, the Activate command 220 needs to identify the row buffer to be utilized by the memory sub-system 215 for storing the data retrieved from the selected row. Accordingly, parameters of the Activate command 220 may include the bank group address 230, the bank address 232, the row address 234, and the row buffer identifier 236. Each of the parameters may be encoded by a group of bits transmitted via corresponding inputs of the memory device 250.

Processing the Activate command 220 may involve decoding the physical address fields 230, 232, and 234 by the row decoder 255 and moving the data from the selected row 260 (identified by the row address 234) of bank 265 (identified by the bank address 232) of the bank group identified by the bank group address 230 to the row buffer 270 identified by the row buffer identifier 236.

FIG. 2B schematically illustrates interactions of the host 210 and memory sub-system 215 executing the ACT (Activate) command in which the row buffer assignment is managed by the memory sub-system, in accordance with aspects of the present disclosure. In an illustrative example, the host 210 may initiate a memory access operation by issuing an ACT (Activate) command 221.

Since the row buffer assignment is managed by the memory sub-system, the Activate command 221 only needs to identify the row, the data from which is to be transferred to the row buffer selected by the memory sub-system. Accordingly, parameters of the Activate command 221 may include the bank group address 230, the bank address 232, and the row address 234. Each of the parameters may be encoded by a group of bits transmitted via corresponding inputs of the memory device 250.

Processing the Activate command 221 may involve decoding the physical address fields 230, 232, and 234 by the row decoder 255 and moving the data from the selected row 260 (identified by the row address 234) of bank 265 (identifier by the bank address 232) of the bank group identified by the bank group address 230 to the row buffer 270, which is selected by the memory sub-system among the available row buffers associated with the bank specified by the Activate command. In an illustrative example, the row buffer is selected based on the row assignment metadata 275, which reflects temporary associations of row buffers with activated rows (e.g., by associating, which each row buffer, a row tags identifying a row that is currently associated with the row buffer). In certain implementations, if all row buffers associated with the selected bank have already been allocated, the memory sub-system may evict the data from one of the allocated row buffers to the corresponding row, thus making the row buffer available for the Activate command 231.

Figure 3A:
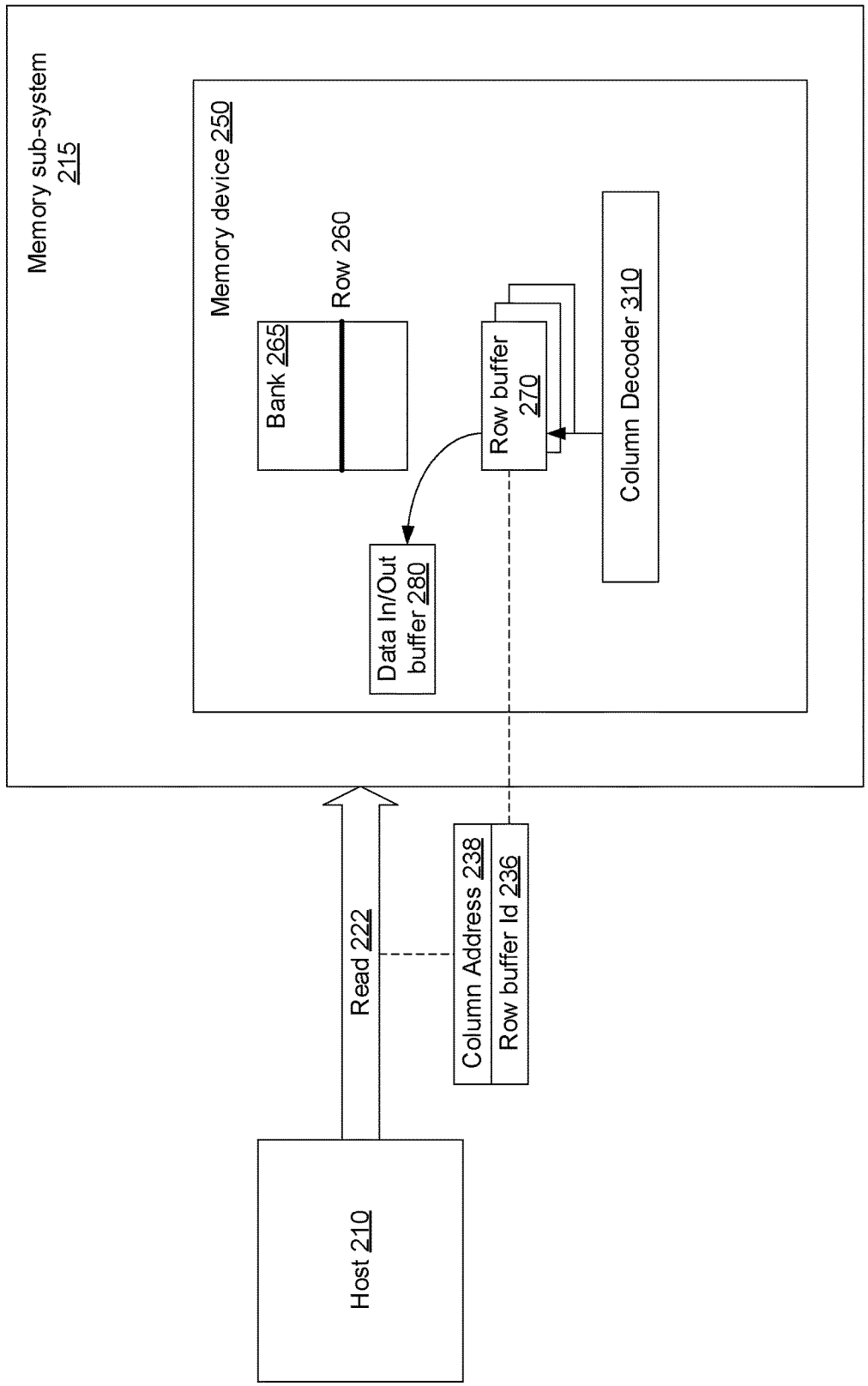
FIG. 3A schematically illustrates interactions of the host and memory sub-system executing the RD (Read) command in which the row buffer assignment is managed by the host.
Figure 3B:
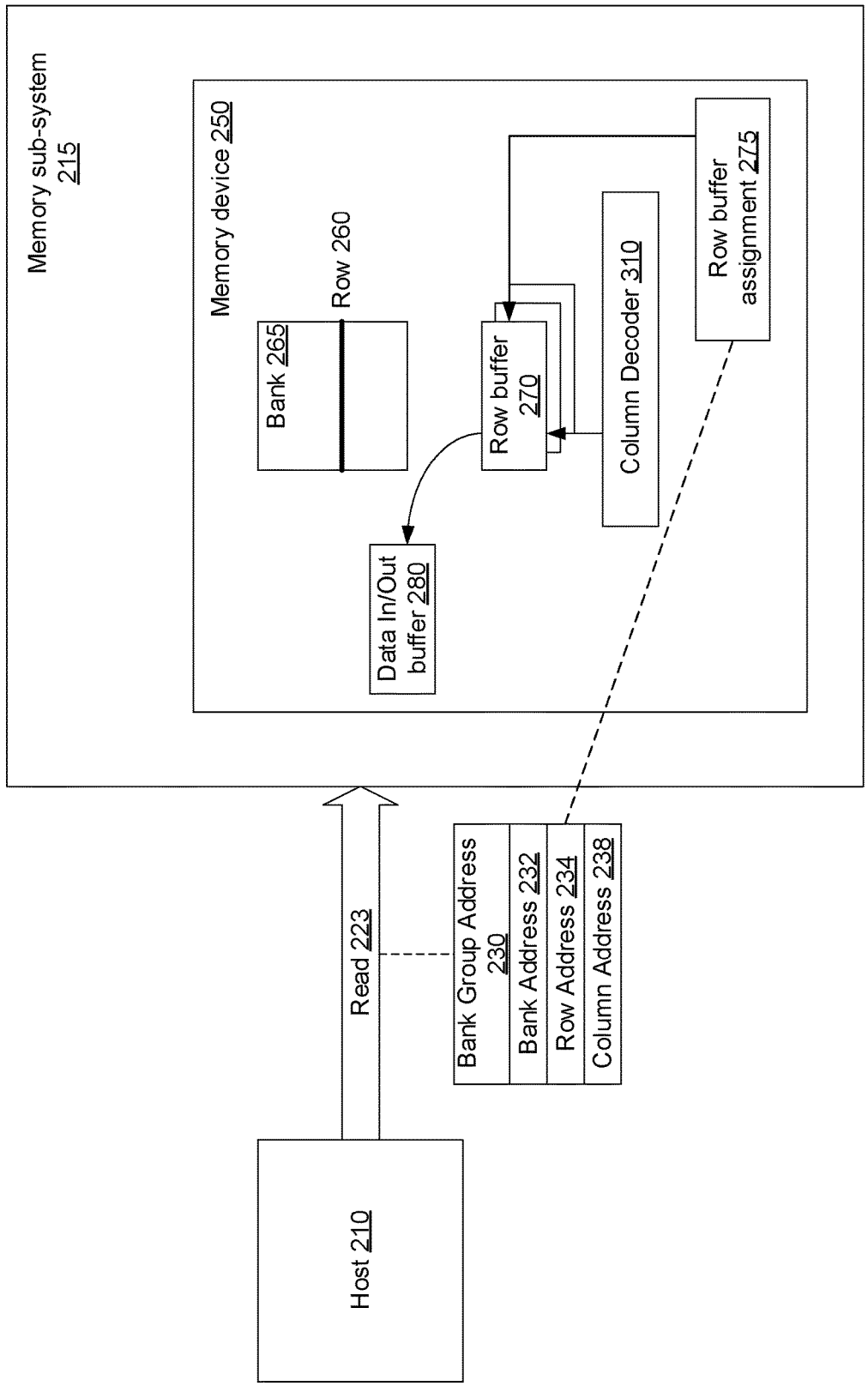
FIG. 3B schematically illustrates interactions of the host and memory sub-system executing the RD (Read) command in which the row buffer assignment is managed by the memory sub-system.

As noted herein above, the Activate command copies the data from memory cells of the selected row to a specified row buffer for subsequent accesses by Read or Write commands. The RD (Read) command, which may be issued after the Activate command, specifies the starting column (bitline) location for the read operation and causes the data to be moved from the specified column location of the row buffer to the memory controller. FIGS. 3A-3B schematically illustrates interactions of the host 210 and memory sub-system 215 executing the RD (Read) command.

In particular, FIG. 3A schematically illustrates interactions of the host 210 and memory sub-system 215 executing a RD (Read) command, in which the row buffer assignment is managed by the host, in accordance with aspects of the present disclosure. In an illustrative example, upon completing the Activate command 220, the host 210 may perform a memory access operation by issuing a RD (Read) command 222.

Since the row buffer assignment is managed by the host 210, the Read command 222 does not need to identify the row from which the data should be read, since the data from the row 260 has already been moved to the row buffer 270 by the previously executed Activate command 220. Therefore, the Read command 222 only needs to identify the row buffer and to specify the column address 238, which is the starting address (i.e., bitline) for performing the read operation. Accordingly, parameters of the Read command 222 may include the row buffer identifier 236 and the column address 238. Each of the parameters may be encoded by a group of bits transmitted via corresponding inputs of the memory device 250.

Processing the Read command 222 may involve moving the data from the specified row buffer 270 (identified by the row buffer identifier 236), starting at the bitline identified by the column address 238, to the data in/out buffer 280, from which the data will be transferred to the memory controller.

FIG. 3B schematically illustrates interactions of the host 210 and memory sub-system 215 executing a RD (Read) command, in which the row buffer assignment is managed by the memory sub-system 215, in accordance with aspects of the present disclosure. In an illustrative example, upon completing the Activate command 221, the host 210 may perform a memory access operation by issuing a RD (Read) command 223.

Since the row buffer assignment is managed by the memory sub-system 215, the Read command 223 needs to identify the row (e.g., by specifying the bank group address 230, the bank address 232, and the row address 234), thus enabling the memory sub-system 215 to identify the row buffer 270, the data from which has been moved to the row buffer 270 by the previously executed Activate command 221. Furthermore, the Read command 223 needs to specify the column address 238, which is the starting address (i.e., bitline) for performing the read operation. Accordingly, parameters of the Read command 223 may include the bank group address 230, the bank address 232, the row address 234, and the column address 238. Each of the parameters may be encoded by a group of bits transmitted via corresponding inputs of the memory device 250.

Processing the Read command 223 may involve identifying (e.g., based on the row assignment metadata 275) the row buffer 270, which has been previously associated with the row identified by the bank group address 230, the bank address 232, and the row address 234. Upon identifying the row buffer 270, the memory sub-system 215 copies the data from the row buffer 270, starting at the bitline identified by the column address 238, to the data in/out buffer 280, from which the data will be transferred to the memory controller.

Figure 4A:
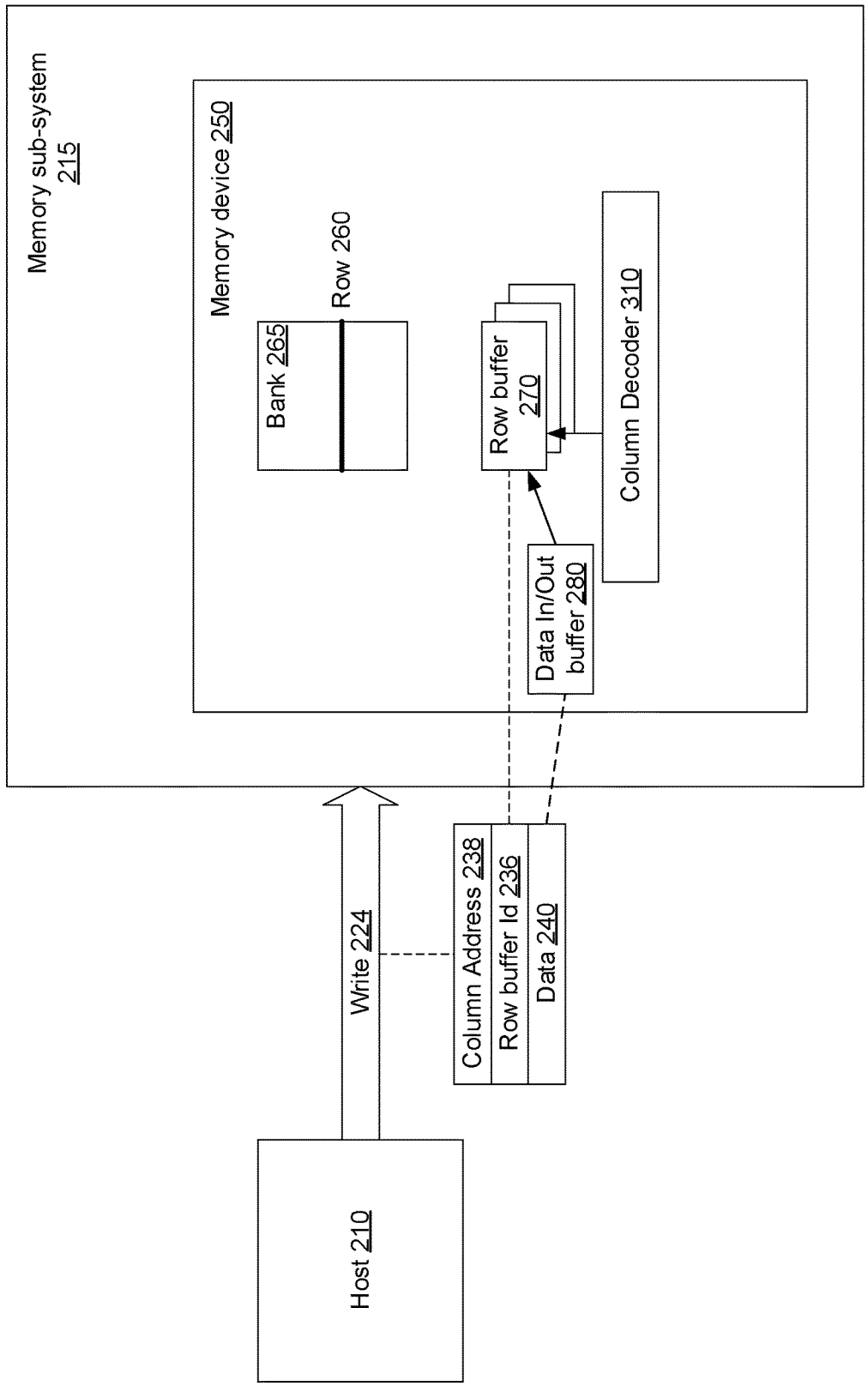
FIG. 4A schematically illustrates interactions of the host and memory sub-system executing the WR (Write) command in which the row buffer assignment is managed by the host.
Figure 4B:
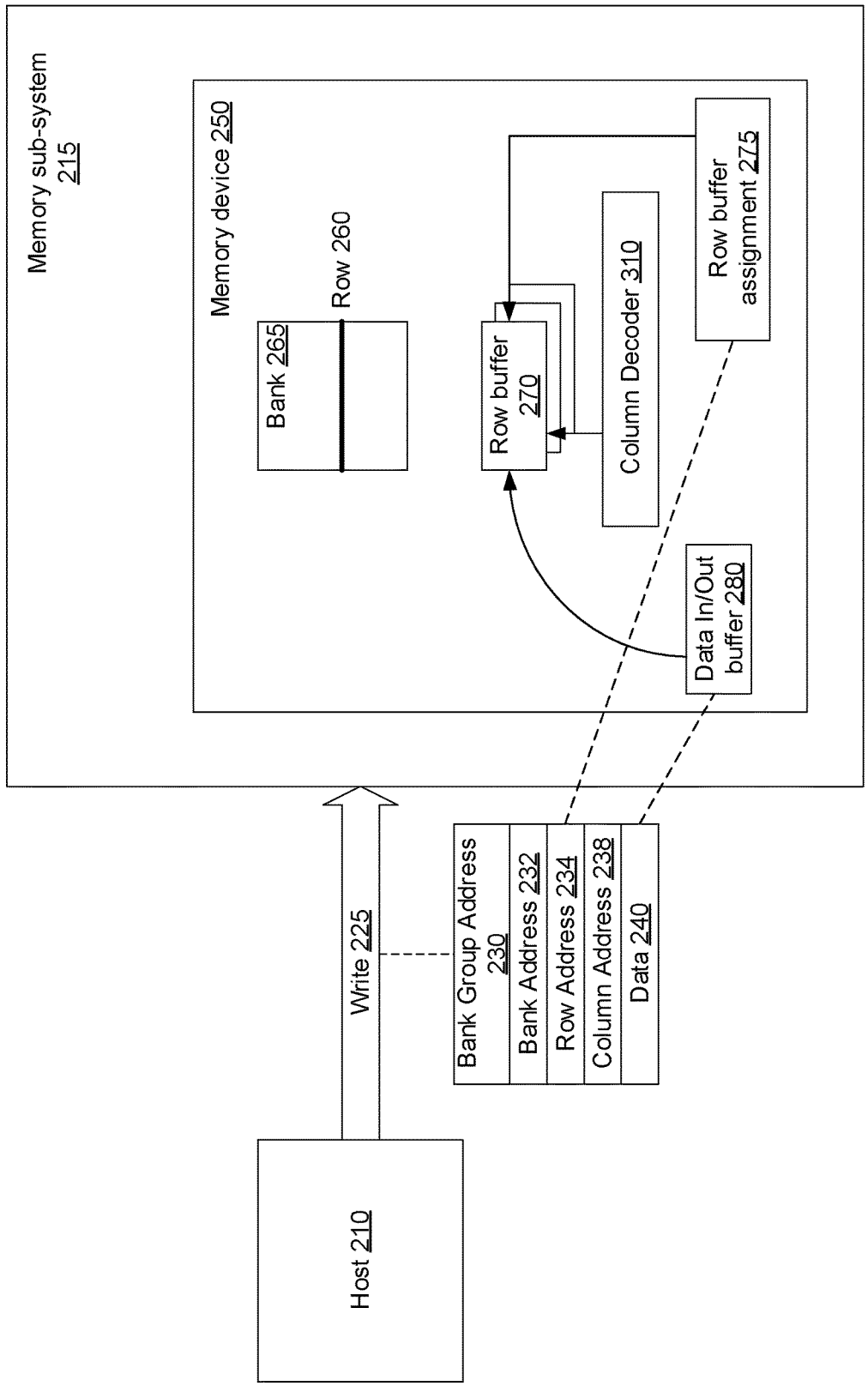
FIG. 4B schematically illustrates interactions of the host and memory sub-system executing the WR (Write) command in which the row buffer assignment is managed by the memory sub-system.

As noted herein above, the WR (Write) command, which may be issued after the Activate command, specifies the starting column (bitline) location for the write operation and causes the data supplied by the memory controller to be stored at the specified column location of the row buffer. FIGS. 4A-4B schematically illustrates interactions of the host 210 and memory sub-system 215 executing the WR (Write) command.

In particular, FIG. 4A schematically illustrates interactions of the host 210 and memory sub-system 215 executing a WR (Write) command, in which the row buffer assignment is managed by the host 210, in accordance with aspects of the present disclosure. In an illustrative example, upon completing the Activate command 220, the host 210 may perform a memory access operation by issuing a WR (Write) command 224.

Since the row buffer assignment is managed by the host 210, the Write command 224 does not need to identify the row to which the data should be written, since the row 260 has already been identified and associated with the row buffer 270 by the previously executed Activate command 220. Therefore, the Write command 224 only needs to identify the row buffer and to specify the column address 238, which is the starting address (i.e., bitline) for performing the write operation. Accordingly, parameters of the Write command 224 may include the row buffer identifier 236, the column address 238, and the data 240 to be written to the specified location of the memory device 250. Each of the parameters may be encoded by a group of bits transmitted via corresponding inputs of the memory device 250.

Processing the Write command 224 may involve moving the data 240 supplied by the Write command parameter, via the in/out buffer 280, to the specified row buffer 270 (identified by the row buffer identifier 236), starting at the bitline identified by the column address 238.

FIG. 4B schematically illustrates interactions of the host 210 and memory sub-system 215 executing a WR (Write) command, in which the row buffer assignment is managed by the memory sub-system 215, in accordance with aspects of the present disclosure. In an illustrative example, upon completing the Activate command 221, the host 210 may perform a memory access operation by issuing a WR (Write) command 223.

Since the row buffer assignment is managed by the memory sub-system 215, the Write command 225 needs to identify the row (e.g., by specifying the bank group address 230, the bank address 232, and the row address 234), thus enabling the memory sub-system 215 to identify the row buffer 270, which has been associated with the selected row by the previously executed Activate command 221. Furthermore, the Write command 225 needs to specify the column address 238, which is the starting address (i.e., bitline) for performing the write operation. Accordingly, parameters of the Write command 225 may include the bank group address 230, the bank address 232, the row address 234, the column address 238, and the data 240 to be written to the specified location of the memory device 250. Each of the parameters may be encoded by a group of bits transmitted via corresponding inputs of the memory device 250.

Processing the Write command 225 may involve identifying (e.g., based on the row assignment metadata 275) the row buffer 270, which has been previously associated with the row identified by the bank group address 230, the bank address 232, and the row address 234. Upon identifying the row buffer 270, the memory sub-system 215 copies the data 240 supplied by the Write command parameter, via the in/out buffer 280, to the identified row buffer 270.

Figure 5A:
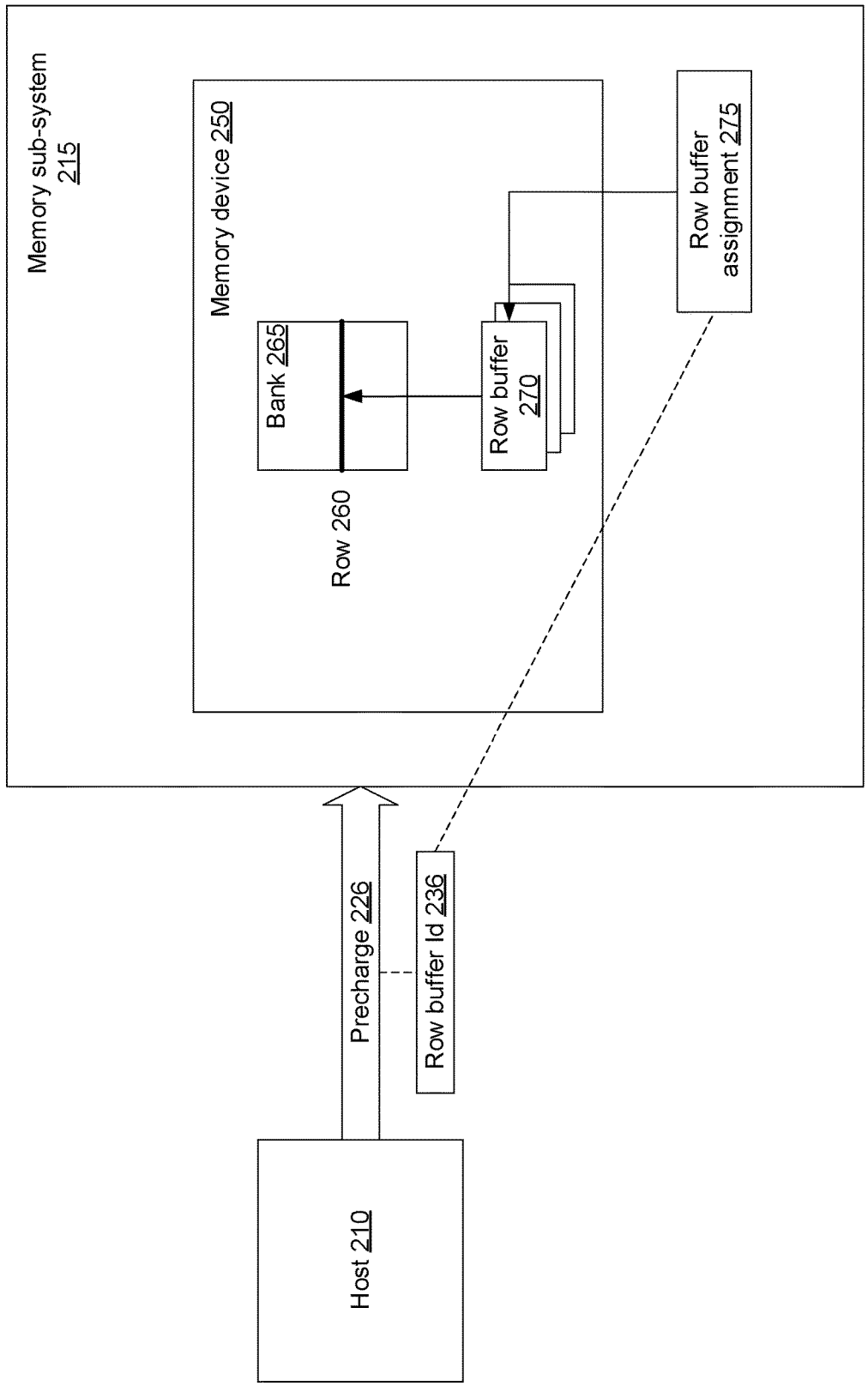
FIG. 5A schematically illustrates interactions of the host and memory sub-system executing the PRE (Precharge) command in which the row buffer assignment is managed by the host.
Figure 5B:
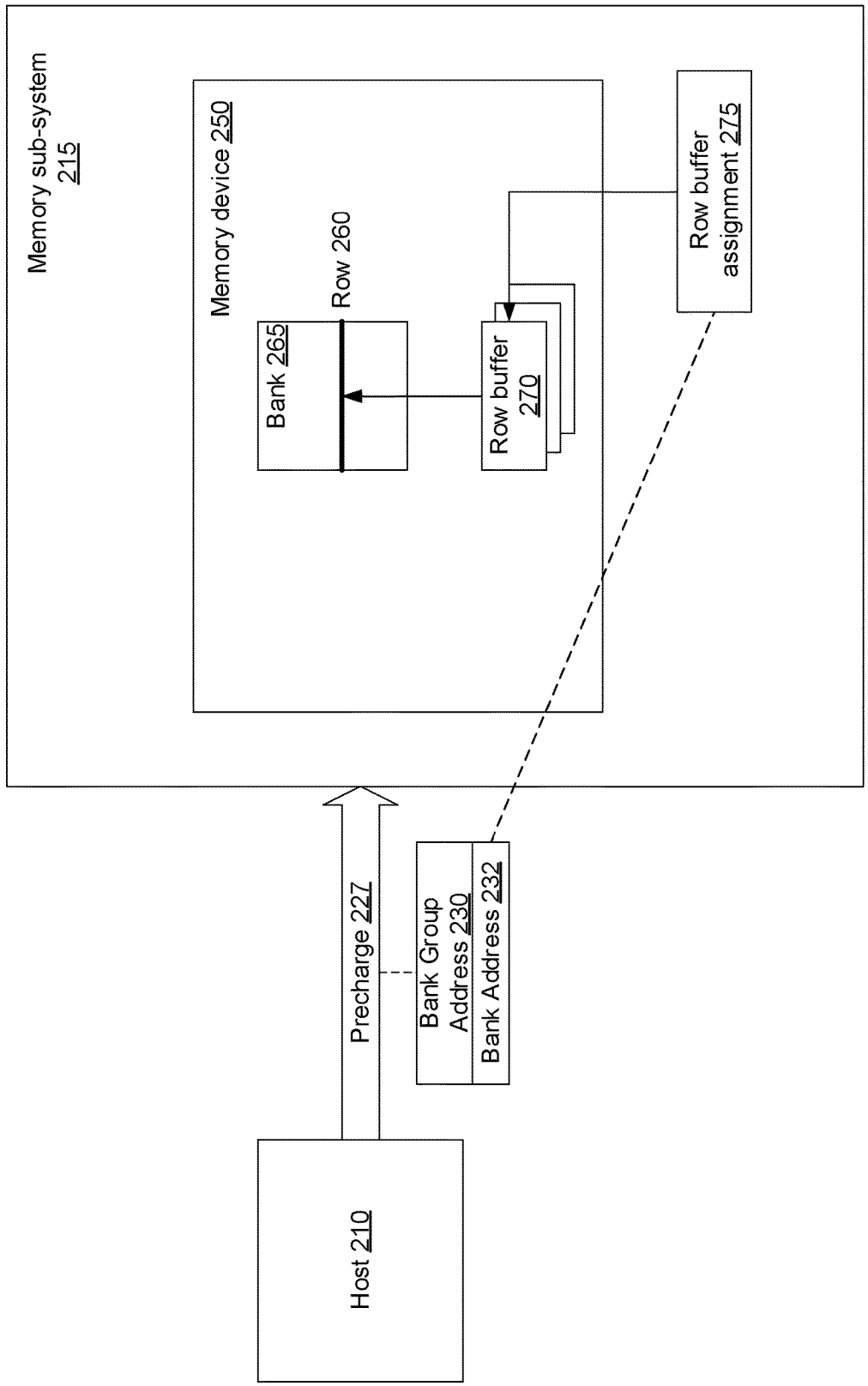
FIG. 5B schematically illustrates interactions of the host and memory sub-system executing the PRE (Precharge) command in which the row buffer assignment is managed by the memory sub-system.

As noted herein above, the selected row would remain active (open) for accesses until the host issues the PRE (Precharge) command which would close the open row by moving the data from the corresponding row buffer to the memory cells of the specified open row. FIGS. 5A-5B schematically illustrates interactions of the host 210 and memory sub-system 215 executing the ACT (Precharge) command.

In particular, FIG. 5A schematically illustrates interactions of the host 210 and memory sub-system 215 executing the PRE (Precharge) command in which the row buffer assignment is managed by the host 210, in accordance with aspects of the present disclosure. In an illustrative example, the host 210 may cause the contents of a specified row buffer to be written to the memory device 250 by issuing the PRE (Precharge) command 226.

Since the row buffer assignment is managed by the host 210, the Precharge command 226 only needs to identify the row buffer the data from which should be stored to the associated row. Accordingly, parameters of the Precharge command 226 may include the row buffer identifier 236. The parameter may be encoded by a group of bits transmitted via corresponding inputs of the memory device 250.

Processing the Precharge command 226 may involve identifying, based on the row assignment metadata 275 maintained by the memory device 250, the row 260 associated with the row buffer 270 identified by the row buffer identifier 236. Upon identifying the row 260, the memory device 250 moves the data from the row buffer 270 identified by the row buffer identifier 236 to the row 260.

FIG. 5B schematically illustrates interactions of the host 210 and memory sub-system 215 executing the PRE (Precharge) command in which the row buffer assignment is managed by the memory sub-system 215, in accordance with aspects of the present disclosure. In an illustrative example, the host 210 may cause the contents of one or more row buffer(s) associated with the identified bank to be written to the memory device 250 by issuing the PRE (Precharge) command 227.

Since the row buffer assignment is managed by the memory sub-system, the Precharge command 227 only needs to identify the bank, while the memory sub-system may identify one or more row buffers associated with the bank, based on the row assignment metadata 275 maintained by the memory sub-system. Accordingly, parameters of the Activate command 221 may include the bank group address 230 and the bank address 232. Each of the parameters may be encoded by a group of bits transmitted via corresponding inputs of the memory device 250.

Processing the Precharge command 227 may involve identifying (e.g., based on the row assignment metadata 275) one or more row buffers 270, which has been previously associated with respective rows of the bank address 232 within the bank group 230. Upon identifying one or more row buffers 270, the memory sub-system 215 copies the data from each identified row buffer 270 to the row associated with the row buffer (e.g., based on the row assignment metadata 275).

As noted herein above, implementations of Activate, Read, Write, and Precharge commands in which the row buffer assignment is managed by the host require the row buffer identifier to be communicated to the memory sub-system as a parameter of the respective command. The row buffer identifier may be encoded by a group of bits transmitted via specified inputs of the memory device 250.

In some implementations, the host 210 may associate each hardware thread (e.g., implemented by a processing core) with one or more row buffers of the memory sub-system 215, such that each hardware thread would serialize its memory access request on a dedicated set of row buffers, thus enabling parallel processing of memory access requests initiated by multiple threads.

Figure 6A:
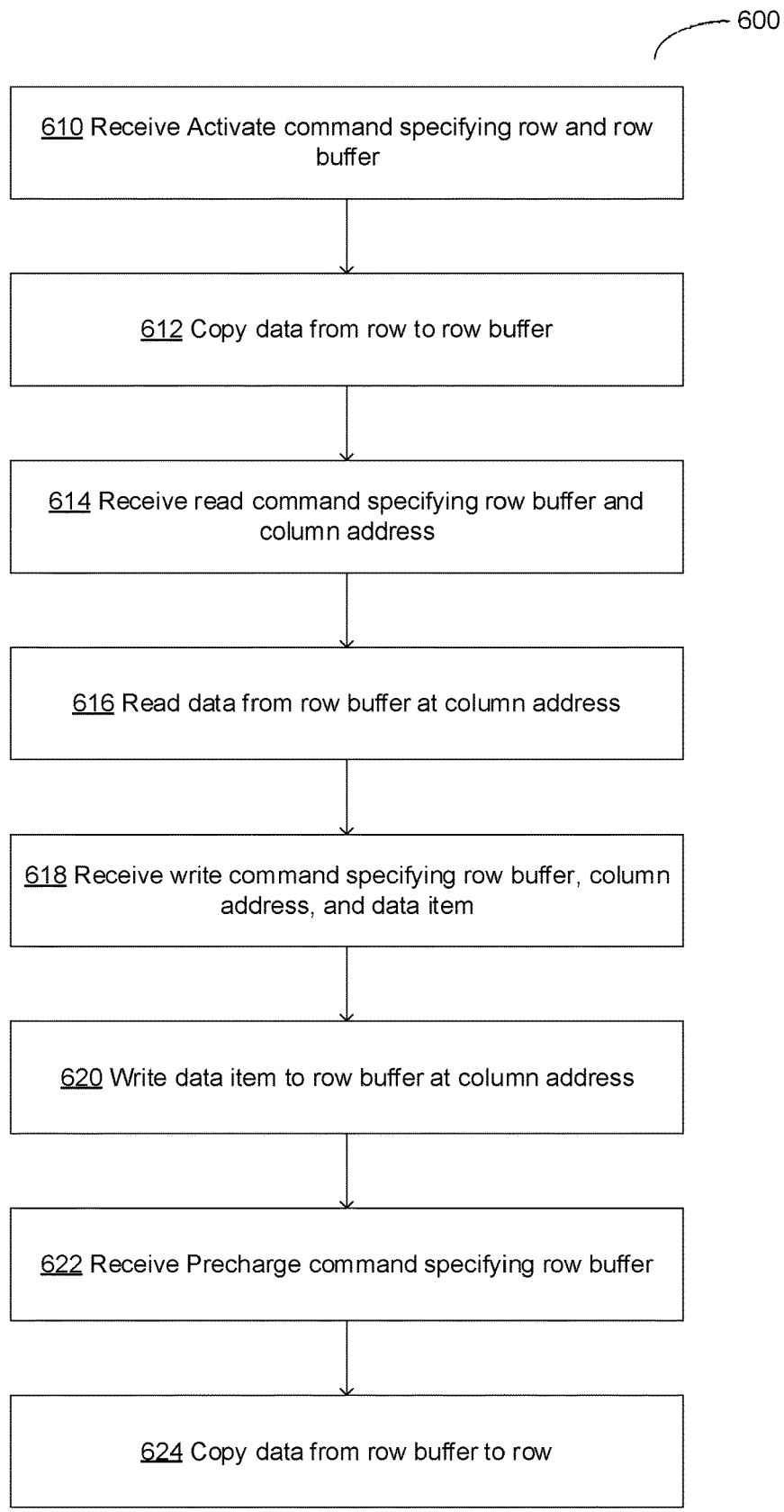
FIG. 6A is a flow diagram of an example method of performing memory access operations by a memory sub-system operating in accordance with embodiments of the present disclosure.

FIG. 6A is a flow diagram of an example method 600 of performing memory access operations by a memory sub-system operating in accordance with embodiments of the present disclosure. As noted herein above, the memory sub-system may include a plurality of memory banks which are grouped in several bank groups. The memory sub-system may further include a plurality of row buffers. In an illustrative example, a subset of row buffers including one or more row buffers may be dedicated to each memory bank. In another illustrative example, a subset of row buffers including two or more row buffers may be dedicated to each memory bank. In another illustrative example, a subset of row buffers including two or more row buffers may be shared between several collocated memory banks, or shared between all memory banks of the memory sub-system.

As noted herein above, in some embodiments, row buffer assignment may be managed by the host in communication with the memory sub-system. Accordingly, the method 600 may be performed by the memory sub-system 215 of FIGS. 2A, 3A, 4A, and 5A. Although the operations of the method are shown in a particular sequence or order, the order of the operations can, unless otherwise specified, be modified. Thus, the illustrated embodiments should be understood only as examples, and the illustrated operations may be performed in a different order, while some operations may be performed in parallel. Additionally, one or more operations may be omitted in some embodiments. Thus, not all illustrated operations are required in every embodiment, and other process flows are possible.

At operation 610, the memory sub-system implementing the method receives, from a host, an Activate command specifying a row (e.g., by providing a bank group address, a bank address, and a row address) and identifying a row buffer associated with the row.

At operation 612, the memory sub-system copies data from the row to the row buffer.

At operation 614, the memory sub-system receives, from the host, a Read command identifying a previously activated row buffer (e.g., the row buffer activated by the operation 620) and further specifying a column address (i.e., the bitline) for performing a read operation.

At operation 616, the memory sub-system reads, from the row buffer, the data starting at the column address.

At operation 618, the memory sub-system receives, from the host, a Write command identifying a previously activated row buffer (e.g., the row buffer activated by the operation 620) and further specifying a column address (i.e., the bitline) and a data item to be written.

At operation 620, the memory sub-system writes the data item to the row buffer, starting at the column address.

At operation 622, the memory sub-system receives, from the host, a Precharge command specifying a row buffer associated with a previously activated row.

At operation 624, the memory sub-system identifies, based on the row assignment metadata, the row associated with the row buffer specified by the Precharge command. Upon identifying the row, the memory sub-system moves the data from the row buffer specified by the Precharge command to the identified row.

Figure 6B:
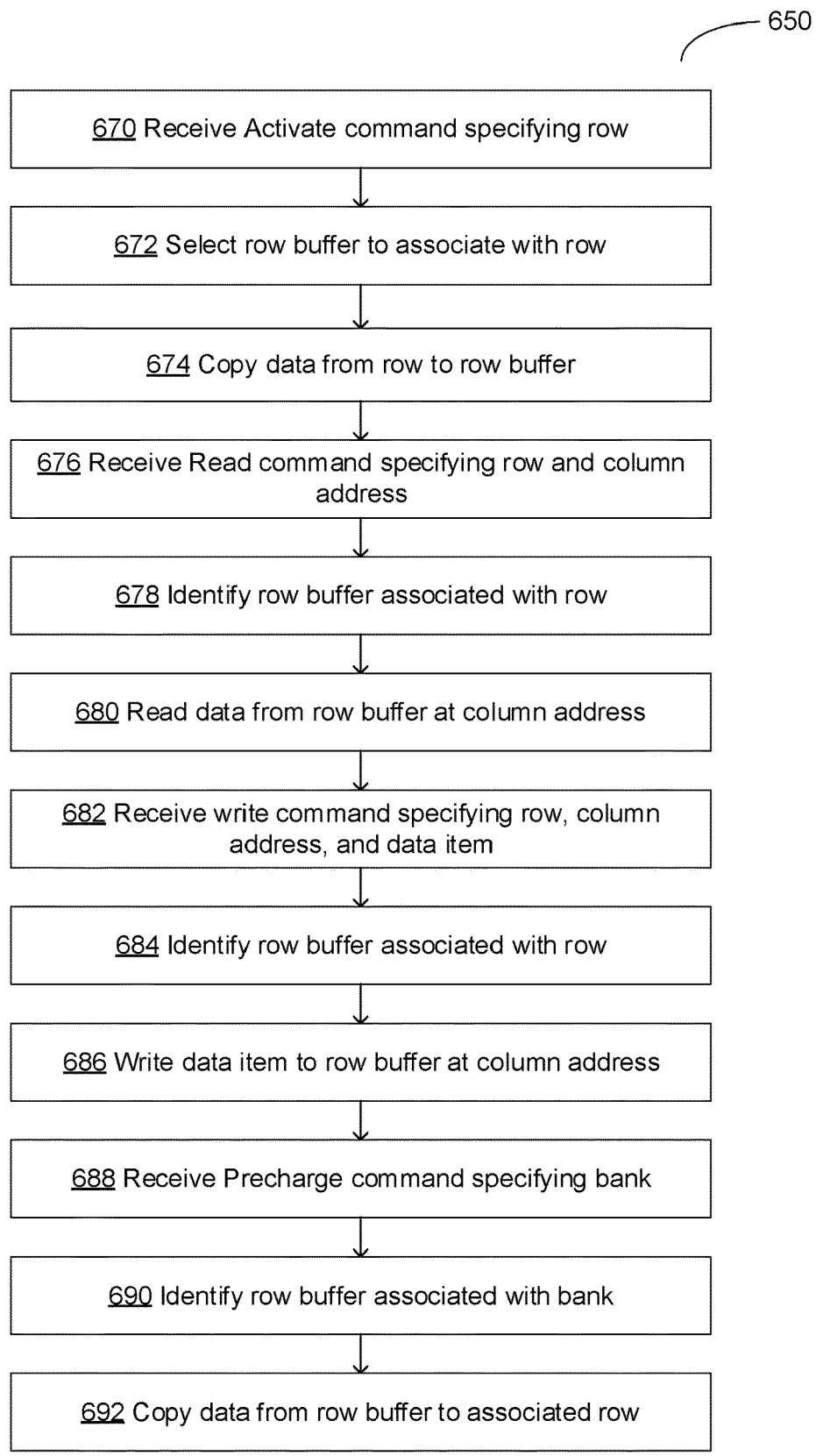
FIG. 6B is a flow diagram of another example method of performing memory access operations by a memory sub-system operating in accordance with embodiments of the present disclosure.

FIG. 6B is a flow diagram of an example method 650 of performing memory access operations by a memory sub-system operating in accordance with embodiments of the present disclosure. As noted herein above, the memory sub-system may include a plurality of memory banks which are grouped in several bank groups. The memory sub-system may further include a plurality of row buffers. In an illustrative example, a subset of row buffers including one or more row buffers may be dedicated to each memory bank. In another illustrative example, a subset of row buffers including two or more row buffers may be dedicated to each memory bank. In another illustrative example, a subset of row buffers including two or more row buffers may be shared between several collocated memory banks, or shared between all memory banks of the memory sub-system.

As noted herein above, in some embodiments, the host may be unaware of the memory buffers available in the memory sub-system, and row buffer assignment may be managed by the memory sub-system. Accordingly, the method 650 may be performed by the memory sub-system 215 of FIGS. 2B, 3B, 4B, and 5B (e.g., by using the row buffer assignment metadata 275). Although the operations of the method are shown in a particular sequence or order, the order of the operations can, unless otherwise specified, be modified. Thus, the illustrated embodiments should be understood only as examples, and the illustrated operations may be performed in a different order, while some operations may be performed in parallel. Additionally, one or more operations may be omitted in some embodiments. Thus, not all illustrated operations are required in every embodiment, and other process flows are possible.

At operation 670, the memory sub-system implementing the method receives, from a host, an Activate command specifying a row (e.g., by providing a bank group address, a bank address, and a row address).

At operation 672, the memory sub-system selects, among the available row buffers associated with the bank specified by the Activate command. In an illustrative example, the row buffer is selected based on the row assignment metadata, which reflects temporary associations of row buffers with activated rows. In certain implementations, if all row buffers associated with the selected bank have already been allocated, the memory sub-system may evict the data from one of the allocated row buffers to the corresponding row, thus making the row buffer available for the Activate command.

At operation 674, the memory sub-system copies data from the row specified by the Activate command to the selected row buffer.

At operation 676, the memory sub-system receives, from the host, a Read command identifying a row (e.g., by providing the bank group address, the bank address, and the row address) and specifying a column address (i.e., the bitline) for performing a read operation.

At operation 678, the memory sub-system identifies (e.g., based on the row assignment metadata) the row buffer, which has been previously associated with the row identified by the parameters of the Read command.

At operation 680, the memory sub-system reads, from the identified row buffer, the data starting at the column address, starting at the column address specified by the Read command.

At operation 682, the memory sub-system receives, from the host, a Write command identifying a row (e.g., by providing the bank group address, the bank address, and the row address) and specifying a column address (i.e., the bitline) and a data item to be written.

At operation 684, the memory sub-system identifies (e.g., based on the row assignment metadata) the row buffer, which has been previously associated with the row identified by the parameters of the Write command.

At operation 686, the memory sub-system writes the data item to the identified row buffer, starting at the column address specified by the Write command.

At operation 688, the memory sub-system receives, from the host, a Precharge command specifying a bank containing a previously activated row (e.g., by providing a bank group address and a bank address).

At operation 690, the memory sub-system identifies (e.g., based on the row assignment metadata) the row buffer, which has been previously associated with a row of the bank identified by the parameters of the Precharge command.

At operation 692, the memory sub-system copies data from the identified row buffer to the row associated with the identified row buffer.

Figure 7:
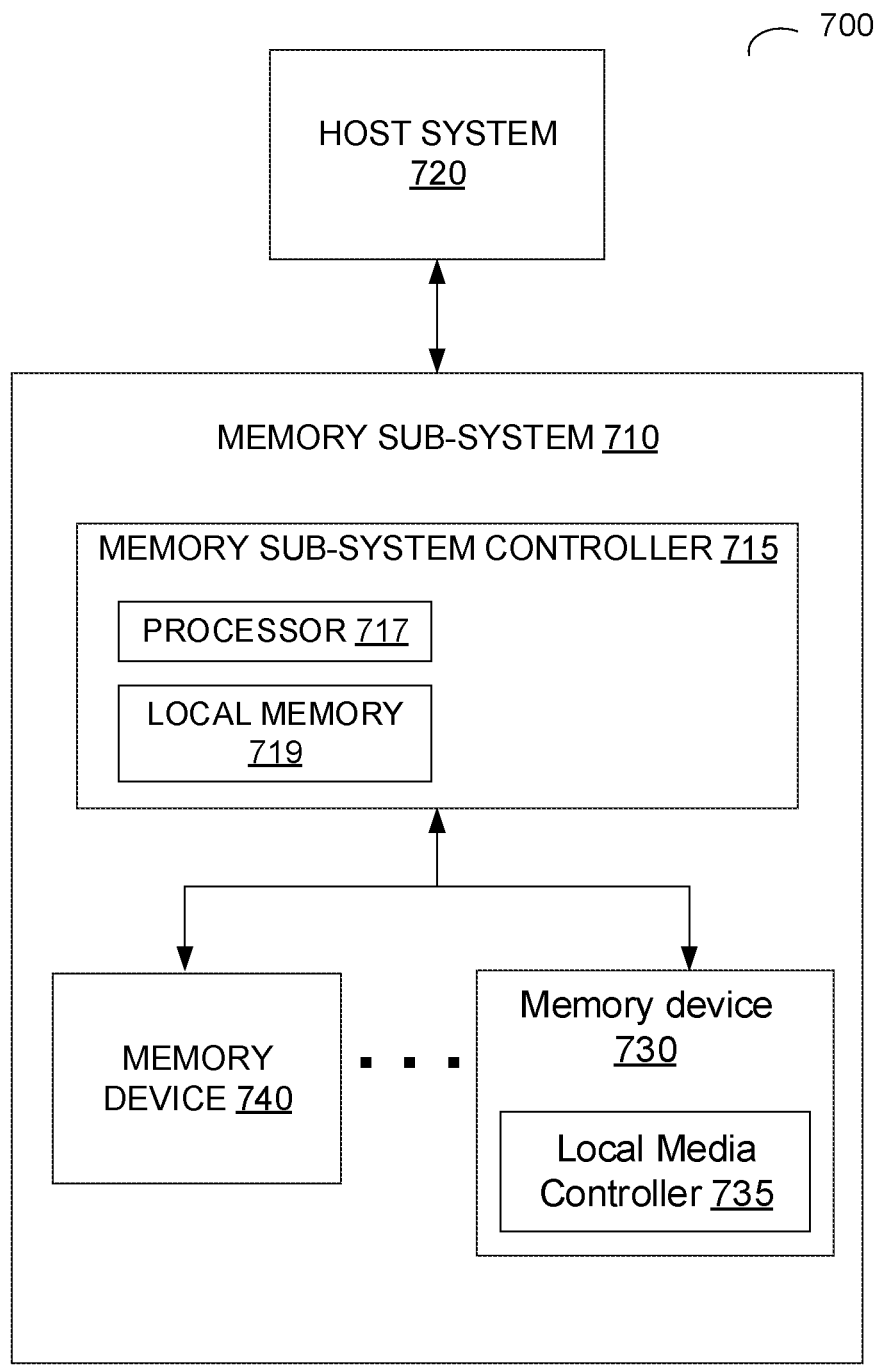
FIG. 7 illustrates an example computing system that includes a memory sub-system implemented in accordance with some embodiments of the present disclosure.

FIG. 7 illustrates an example computing system 700 that includes a memory sub-system 710 implemented in accordance with some embodiments of the present disclosure. The memory sub-system 710 may include media, such as one or more volatile memory devices (e.g., memory device 740), one or more non-volatile memory devices (e.g., memory device 730), or a combination of such. In some embodiments, the memory sub-system 710 corresponds to the memory sub-system 100 to FIG. 1.

The memory sub-system 710 may be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 700 may be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 700 may include a host system 720 that is coupled to one or more memory sub-systems 710. In some embodiments, the host system 720 is coupled to different types of memory sub-systems 710. FIG. 7 illustrates one example of a host system 720 coupled to one memory sub-system 710. The host system 720 may include a processor chipset and a software stack executed by the processor chipset. The processor chipset may include one or more cores, one or more caches, a memory controller (e.g., NVDIMM controller), and a storage protocol controller (e.g., PCIe controller, SATA controller). The host system 720 uses the memory sub-system 710, for example, to write data to the memory sub-system 710 and read data from the memory sub-system 710.

The host system 720 may be coupled to the memory sub-system 710 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface may be used to transmit data between the host system 720 and the memory sub-system 710. The host system 720 may further utilize an NVM Express (NVMe) interface to access components (e.g., memory devices 730) when the memory sub-system 710 is coupled with the host system 720 by the PCIe interface 105. The physical host interface 105 may provide an interface for passing control, address, data, and other signals between the memory sub-system 710 and the host system 720. FIG. 7 illustrates a memory sub-system 710 as an example. In general, the host system 720 may access multiple memory sub-systems via a same communication connection, multiple separate communication connections, and/or a combination of communication connections.

The memory devices 730, 740 may include any combination of the different types of non-volatile memory devices and/or volatile memory devices. The volatile memory devices (e.g., memory device 740) may be, but are not limited to, random access memory (RAM), such as dynamic random access memory (DRAM) and synchronous dynamic random access memory (SDRAM).

Some examples of non-volatile memory devices (e.g., memory device 730) include negative-and (NAND) type flash memory and write-in-place memory, such as a three-dimensional cross-point ("3D cross-point") memory device, which is a cross-point array of non-volatile memory cells. A cross-point array of non-volatile memory may perform bit storage based on a change of bulk resistance, in conjunction with a stackable cross-gridded data access array. Additionally, in contrast to many flash-based memories, cross-point non-volatile memory may perform a write in-place operation, where a non-volatile memory cell may be programmed without the non-volatile memory cell being previously erased. NAND type flash memory includes, for example, two-dimensional NAND (2D NAND) and three-dimensional NAND (3D NAND).

Each of the memory devices 730 may include one or more arrays of memory cells. One type of memory cell, for example, single level cells (SLC) may store one bit per cell. Other types of memory cells, such as multi-level cells (MLCs), triple level cells (TLCs), and quad-level cells (QLCs), may store multiple bits per cell. In some embodiments, each of the memory devices 730 may include one or more arrays of memory cells such as SLCs, MLCs, TLCs, QLCs, or any combination of such. In some embodiments, a particular memory device may include an SLC portion, and an MLC portion, a TLC portion, or a QLC portion of memory cells. The memory cells of the memory devices 730 may be grouped as pages that may refer to a logical unit of the memory device used to store data. With some types of memory (e.g., NAND), pages may be grouped to form blocks.

Although non-volatile memory devices such as 3D cross-point array of non-volatile memory cells and NAND type memory (e.g., 2D NAND, 3D NAND) are described, the memory device 730 may be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 775 may communicate with the memory devices 730 to perform operations such as reading data, writing data, or erasing data at the memory devices 730 and other such operations. The memory sub-system controller 775 may include hardware such as one or more integrated circuits and/or discrete components, a buffer memory, or a combination thereof. The hardware may include digital circuitry with dedicated (i.e., hard-coded) logic to perform the operations described herein. The memory sub-system controller 775 may be a microcontroller, special purpose logic circuitry (e.g., a field programmable gate array (FPGA), an application specific integrated circuit (ASIC), etc.), or other suitable processor.

The memory sub-system controller 775 may include a processor 717 (e.g., a processing device) configured to execute instructions stored in a local memory 719. In the illustrated example, the local memory 719 of the memory sub-system controller 775 includes an embedded memory configured to store instructions for performing various processes, operations, logic flows, and routines that control operation of the memory sub-system 710, including handling communications between the memory sub-system 710 and the host system 720. In some embodiments, the processor 717 may implement the methods 600-650, as described in more detail herein above.

In some embodiments, the local memory 719 may include memory registers storing memory pointers, fetched data, etc. The local memory 719 may also include read-only memory (ROM) for storing micro-code. While the example memory sub-system 710 in FIG. 7 has been illustrated as including the controller 775, in another embodiment of the present disclosure, a memory sub-system 710 does not include a controller 775, and may instead rely upon external control (e.g., provided by an external host, or by a processor or controller separate from the memory sub-system).

In general, the memory sub-system controller 775 may receive commands or operations from the host system 720 and may convert the commands or operations into instructions or appropriate commands to achieve the desired access to the memory devices 730. The memory sub-system controller 775 may be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 730. The memory sub-system controller 775 may further include host interface circuitry to communicate with the host system 720 via the physical host interface. The host interface circuitry may convert the commands received from the host system into command instructions to access the memory devices 730 as well as convert responses associated with the memory devices 730 into information for the host system 720.

The memory sub-system 710 may also include additional circuitry or components that are not illustrated. In some embodiments, the memory sub-system 710 may include a cache or buffer (e.g., DRAM) and address circuitry (e.g., a row decoder and a column decoder) that may receive an address from the controller 775 and decode the address to access the memory devices 730.

In some embodiments, the memory devices 730 include local media controllers 735 that operate in conjunction with memory sub-system controller 775 to execute operations on one or more memory cells of the memory devices 730. An external controller (e.g., memory sub-system controller 775) may externally manage the memory device 730 (e.g., perform media management operations on the memory device 730). In some embodiments, memory sub-system 710 is a managed memory device, which is a raw memory device 730 having control logic (e.g., local media controller 735) on the die and a controller (e.g., memory sub-system controller 775) for media management within the same memory device package. An example of a managed memory device is a managed NAND (MNAND) device.

Figure 8:
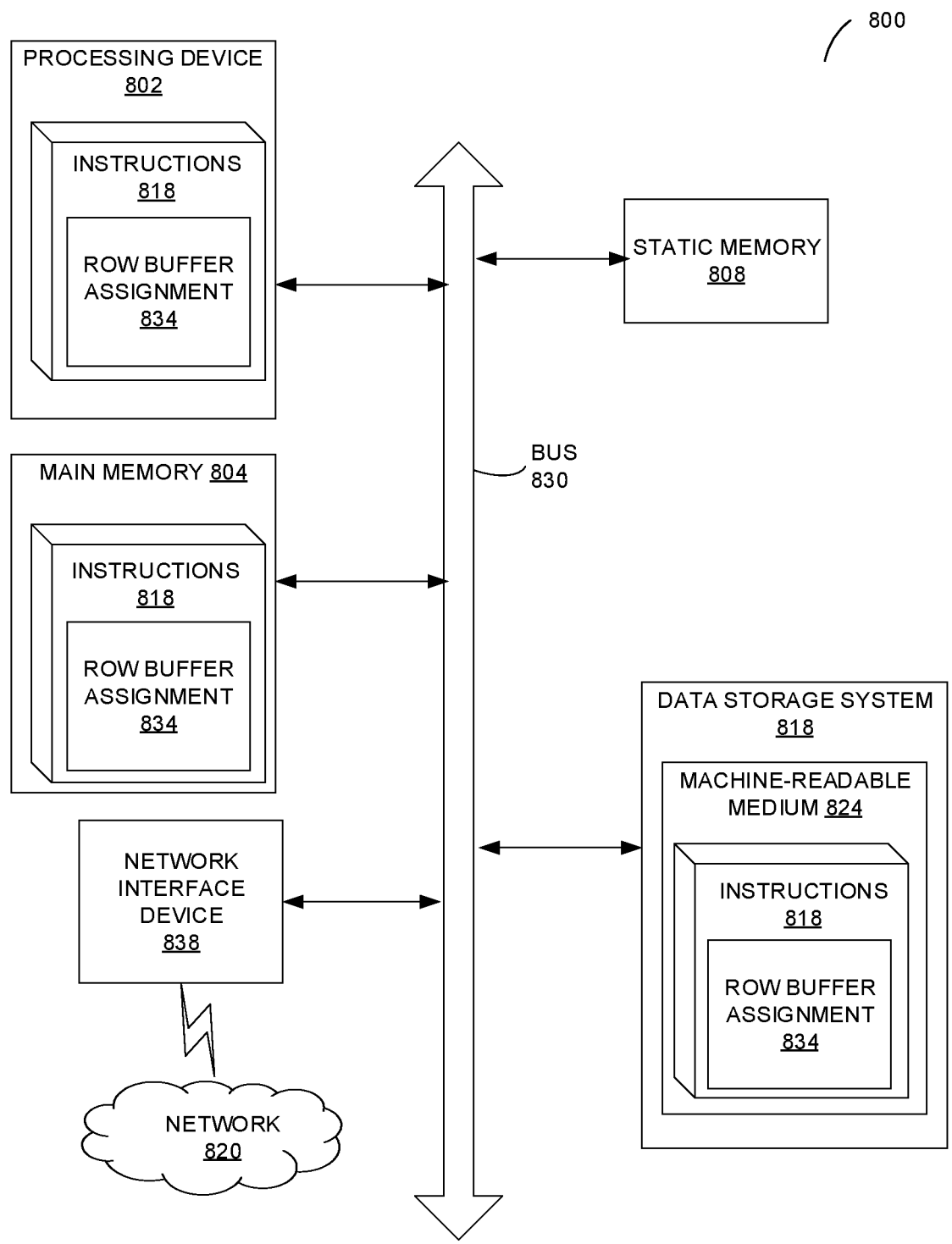
FIG. 8 is a block diagram of an example host computer system in which embodiments of the present disclosure may operate.

FIG. 8 illustrates an example machine of a computer system 800 within which a set of instructions, for causing the machine to perform any one or more of the methods discussed herein, may be executed. In some embodiments, the computer system 800 may correspond to a host system (e.g., the host system 120 of FIG. 7) that includes, is coupled to, or utilizes a memory sub-system (e.g., the memory sub-system 100 of FIG. 1 or the memory sub-system 710 of FIG. 7).

In alternative embodiments, the machine may be connected (e.g., a network interface device 838 coupled to the network 820) to other computer system in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methods discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 808 (e.g., flash memory, static random access memory (SRAM), etc.), and a data storage system 818, which communicate with each other via a bus 830.

Processing device 802 represents one or more general-purpose processing devices such as a microprocessor, a CPU, or the like. More particularly, the processing device may be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 is configured to execute instructions 828 for performing the operations and steps discussed herein (e.g., managing the row buffer assignment, as described in more detail herein above).

The data storage system 818 may include a machine-readable storage medium 824 (also known as a computer-readable medium) on which is stored one or more sets of instructions 828 or software embodying any one or more of the methodologies or functions described herein. The instructions 828 may also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 may correspond to the memory sub-system 110 of FIG. 7.

In one embodiment, the instructions 828 include instructions to implement the row buffer assignment 834 in accordance with some embodiments of the present disclosure. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure may refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus may be specially constructed for the intended purposes, or it may include a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the present disclosure have been described with reference to specific example embodiments thereof. It will be evident that various modifications may be made thereto without departing from the broader spirit and scope of embodiments of the present disclosure as set forth in the following claims. The specification and drawings are, accordingly, to be regarded in an illustrative sense rather than a restrictive sense.

What is claimed is:

1. A memory sub-system, comprising:
   a plurality of bank groups, wherein each bank group comprises a plurality of memory banks;
   a plurality of row buffers, wherein two or more row buffers of the plurality of row buffers are shared between two or more memory banks of a bank group of the plurality of bank groups;
   a processing logic communicatively coupled to the plurality of bank groups and the plurality of row buffers, the processing logic to perform operations comprising:
      receiving, from a host, a command identifying a row of a certain memory bank;
      identifying, among the plurality of row buffers, a row buffer associated with the row by row buffer assignment metadata, wherein the row buffer assignment metadata comprises, for each row buffer of the plurality of row buffers, a corresponding tag identifying a row that is temporarily associated with the row buffer; and
      perform a memory access operation using the row buffer.

2. The memory sub-system of claim 1, wherein the plurality of bank groups are comprised by a dynamic random access memory (DRAM) device.

3. The memory sub-system of claim 1, wherein a first row buffer of the plurality of row buffers and a second row buffer of the plurality of row buffers are exclusively associated with a first bank group of the plurality of bank groups.

4. The memory sub-system of claim 1, wherein the command is an activate command further specifying a row of a certain memory bank, and wherein performing the memory access operation comprises:
   copying data from the row to the row buffer.

5. The memory sub-system of claim 1, wherein the command is a read command further specifying a column address, and wherein performing the memory access operation comprises:
   reading data from a location of the row buffer, wherein the location is identified by the column address.

6. The memory sub-system of claim 1, wherein the command is a write command further specifying a column address and a data item, and wherein performing the memory access operation comprises:
   writing the data item to a location of the row buffer, wherein the location is identified by the column address.

7. The memory sub-system of claim 1, wherein the command is a precharge command further specifying the row buffer, and wherein performing the memory access operation comprises:
   copying data from the row buffer to a row associated with the row buffer.

8. A memory sub-system, comprising:
   a plurality of bank groups, wherein each bank group comprises a plurality of memory banks;
   a plurality of row buffers, wherein two or more row buffers of the plurality of row buffers are associated with each bank group;
   a processing logic communicatively coupled to the plurality of bank groups and the plurality of row buffers, the processing logic to perform operations comprising:
      receiving, from a host, a command identifying a row of a certain memory bank;
      identifying, among the plurality of row buffers, a row buffer associated with the row by row buffer assignment metadata, wherein the row buffer assignment metadata comprises, for each row buffer of the plurality of row buffers, a corresponding tag identifying a row that is temporarily associated with the row buffer; and
      performing a memory access operation using the row buffer.

9. The memory sub-system of claim 8, wherein the plurality of bank groups are comprised by a dynamic random access memory (DRAM) device.

10. The memory sub-system of claim 8, wherein a first row buffer of the plurality of row buffers and a second row buffer of the plurality of row buffers are exclusively associated with a first bank group of the plurality of bank groups.

11. The memory sub-system of claim 8, wherein a first row buffer of the plurality of row buffers and a second row buffer of the plurality of row buffers are exclusively associated with a first memory bank of the plurality of memory banks associated with a first bank group.

12. The memory sub-system of claim 8, wherein the command is an activate command, and wherein performing the memory access operation comprises:
   copying data from the row to the row buffer.

13. The memory sub-system of claim 8, wherein the command is a read command further specifying a column address, and wherein performing the memory access operation comprises:
   reading data from a location of the row buffer, wherein the location is identified by the column address.

14. The memory sub-system of claim 8, wherein the command is a write command further specifying a column address and a data item, and wherein performing the memory access operation comprises:

writing the data item to a location of the row buffer, wherein the location is identified by the column address.

15. The memory sub-system of claim 8, wherein the command is a precharge command, and wherein performing the memory access operation comprises:

copying data from the row buffer to the row.

16. A method, comprising:

receiving, by a memory sub-system comprising a plurality of memory banks grouped into a plurality of bank groups, a command from a host, the command identifying a row of a certain memory bank of the plurality of memory banks;

identify, among a set of row buffers associated with the memory bank, a row buffer associated with the row by row buffer assignment metadata, wherein the row buffer assignment metadata comprises, for each row buffer of the set of row buffers, a corresponding tag identifying a row that is temporarily associated with the row buffer; and perform a memory access operation using the row buffer.

17. The method of claim 16, wherein the command is an activate command, and wherein performing the memory access operation comprises:

copying data from the row to the row buffer.

18. The method of claim 16, wherein the command is a read command further specifying a column address, and wherein performing the memory access operation comprises:

reading data from a location of the row buffer, wherein the location is identified by the column address.

19. The method of claim 16, wherein the command is a precharge command, and wherein performing the memory access operation comprises:

copying data from the row buffer to the row.

20. The method of claim 16, wherein the command is a write command further specifying a column address and a data item, and wherein performing the memory access operation comprises:

writing the data item to a location of the row buffer, wherein the location is identified by the column address.

* * * * *